United States Patent
Sasaki et al.

(10) Patent No.: US 6,522,323 B1
(45) Date of Patent: Feb. 18, 2003

(54) LEVEL SHIFT CIRCUIT AND IMAGE DISPLAY DEVICE

(75) Inventors: Osamu Sasaki, Tenri (JP); Yasuyuki Ogawa, Tenri (JP); Yutaka Takafuji, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 165 days.

(21) Appl. No.: 09/617,255

(22) Filed: Jul. 14, 2000

(30) Foreign Application Priority Data

Mar. 30, 1999 (JP) .................................... 2000-092725
Jul. 15, 1999 (JP) ........................................ 11-201100

(51) Int. Cl.[7] ..................... G09G 5/00; H03K 19/0175; H03L 5/00
(52) U.S. Cl. .................. 345/204; 345/211; 345/214; 326/62; 326/81; 327/333
(58) Field of Search ................ 345/204, 211, 345/212, 214, 215, 98; 326/81, 66, 63, 62; 365/189.11, 185.18; 327/333

(56) References Cited

U.S. PATENT DOCUMENTS

| | | | | |
|---|---|---|---|---|
| 4,316,105 A | * | 2/1982 | Fowler | 307/362 |
| 4,906,871 A | * | 3/1990 | Iida | 307/475 |
| 5,237,212 A | | 8/1993 | Maekawa | |
| 5,541,546 A | * | 7/1996 | Okumura | 327/333 |
| 5,936,434 A | * | 8/1999 | Kumamoto et al. | 327/93 |
| 5,942,915 A | * | 8/1999 | Asada | 326/81 |
| 5,973,508 A | * | 10/1999 | Nowak et al. | 326/81 |
| 6,049,228 A | * | 4/2000 | Moon | 326/81 |
| 6,107,857 A | * | 8/2000 | Orisaka et al. | 327/333 |
| 6,359,491 B1 | * | 3/2002 | Cairns et al. | 327/333 |

FOREIGN PATENT DOCUMENTS

| | | |
|---|---|---|
| EP | 0 599 273 | 6/1994 |
| JP | 4-242317 | 8/1992 |
| JP | 6-216753 | 8/1994 |

* cited by examiner

Primary Examiner—Bipin Shalwala
Assistant Examiner—David L Lewis
(74) Attorney, Agent, or Firm—Nixon & Vanderhye P.C.

(57) ABSTRACT

In a level shift circuit, a bias voltage setting section sets the voltage level of swing of an input signal IN, while an amplifier circuit section amplifies the amplitude of the input signal IN. This arrangement needs only one input signal without its inverted signal and allows the level shift circuit to be monolithically formed on a substrate identical to that of another drive circuit. This further obviates the need for adjusting the bias voltage every image display device using this level shift circuit.

22 Claims, 13 Drawing Sheets

<INPUT-OUTPUT VOLTAGE CHARACTERISTICS OF AMPLIFIER CIRCUIT SECTION>

<OUTPUT SIGNAL OF AMPLIFIER CIRCUIT SECTION>

LEVEL SHIFT CIRCUIT AND IMAGE DISPLAY DEVICE

BACKGROUND OF THE INVENTION

The present invention relates to a level shift circuit and an image display device employing the circuit, and in particular, to a level shift circuit that is incorporated in an image display device of a driver monolithic type (drive circuit integrated type) and amplifies an input signal having small amplitude (logic level) and the image display device.

In recent years, researches and developments of display devices employing liquid crystals have been remarkably promoted, and in particular, a TFT (Thin Film Transistor) liquid crystal display device employing polysilicon is expected to have great demands in future. The TFT liquid crystal display device employing polysilicon has electron and hole mobility that is two orders of magnitude greater than that of a device employing amorphous silicon and is able to have a CMOS structure of a combination of an n-channel TFT and a p-channel TFT. Therefore, in contrast to the TFT liquid crystal display device employing amorphous silicon in which the drive circuit must be formed of, for example, single crystal silicon outside the substrate of a pixel TFT for a liquid crystal cell, a drive circuit can be formed on a substrate identical to that of the pixel TFT for the liquid crystal cell using polysilicon. That is, a driver monolithic type TFT liquid crystal display device can be formed, and this allows the compacting, functional improvement and cost reduction to be achieved.

FIG. 11 shows the construction of the driver monolithic type TFT liquid crystal display device. FIG. 11 shows a video signal terminal 1 for inputting a video signal from the outside, a counter voltage terminal 2 for inputting a voltage to an opposite electrode, a shift register 3 for driving n (n: integer n>1) gate bus lines, a shift register 4 for driving m (m: integer m>1) source bus lines, level shift circuits 5 through 8 for amplifying the amplitude of an input control signal, a start pulse SPV to be inputted to the shift register 3, clock signals φ1V and φ2V having a frequency equal to a horizontal period, drive pulses φV1 through φVn that are to turn on and off TFT elements and outputted from the shift register 3, gate bus lines G1 through Gn, a start pulse SPH to be inputted to the shift register 4, clock signals φ1H and φ2H having a frequency m times the horizontal period, sampling pulses φH1 through φHm outputted from the shift register 4, sampling switches M1 through Mm to sample a video signal, source bus lines L1 through Lm, TFT elements M11 through Mnm provided at the intersections of the source bus lines L1 through Lm and the gate bus lines G1 through Gn and liquid crystal cells C11 through Cnm that exist between the pixel electrodes and the opposite electrodes connected to the TFT elements M11 through Mnm.

In FIG. 11, the level shift circuits 5 through 8 are provided with a circuit for amplifying the amplitudes of the start pulses SPV and SPH and the clock signals φ1V, φ2V, φ1H and φ2H. In the driver monolithic type TFT liquid crystal display device, the drive circuit is constructed of polysilicon. However, the threshold voltage of the transistor becomes higher than that of a device whose drive circuit is formed of single crystal silicon. Therefore, the amplification levels of the start pulses SPV and SPH and the clock signals φ1V, φ2V, φ1H and φ2H, which have logic level power voltages of 3 V, 3.3 V and 5 V, are not regarded as sufficiently high. The levels are required to be raised up to a voltage of, for example, 12 to 15 V, for which the level shift circuits 5 through 8 are provided.

FIG. 12 shows a conventional level shift circuit. FIG. 12 shows a positive power voltage $V_{DD}$, a negative power voltage GND, an input signal IN, an input signal (/IN) whose voltage level is inverted relative to the input signal IN, an output signal OUT, p-channel TFT's p121, p122 and p123, and n-channel TFT's n121, n122 and n123.

In FIG. 12, the input signal IN is inputted to the gate of an n-channel TFT n121, while the input signal (/IN) is inputted to the gate of an n-channel TFT n122. The drain of the n-channel TFT n121 is connected to the drain and gate of a p-channel TFT p121 and the gate of a p-channel TFT p122, while the drain of the n-channel TFT n122 is connected to the drain of the p-channel TFT p122 and an input terminal of an inverter circuit section constructed of a p-channel TFT p123 and an n-channel TFT n123. The source of the p-channel TFT p121 and the source of the p-channel TFT p122 are connected to the positive power voltage $V_{DD}$, while the source of the n-channel TFT n121 and the source of the n-channel TFT n122 are connected to the negative power voltage GND.

Reference is made to the operation of the conventional level shift circuit shown in FIG. 12. If the input signal IN has high level and the input signal (/IN) has low level, then the n-channel TFT n121 is turned on, and the n-channel TFT n122 is turned off. Then, the negative power voltage GND is inputted to the gate of the p-channel TFT p121 and the gate of the p-channel TFT p122, when the p-channel TFT p121 is regarded as a resistance component, flowing a current between the positive power voltage $V_{DD}$ and the negative power voltage GND. On the other hand, the p-channel TFT p122 is turned on, by which the drain of the p-channel TFT p122 and the input terminal of the inverter circuit section constructed of the p-channel TFT p123 and the n-channel TFT n123 are charged with the positive power voltage $V_{DD}$, outputting the negative power voltage GND from the output terminal of the inverter circuit section. If the input signal IN is inverted to low level and the input signal (/IN) is inverted to high level, then the n-channel TFT n121 is turned off, and the n-channel TFT n122 is turned on. Then, the input terminal of the inverter circuit section constructed of the p-channel TFT p123 and the n-channel TFT n123 is discharged to the negative power voltage GND, and the positive power voltage $V_{DD}$ is outputted from the output terminal of the inverter circuit section. That is, the amplitude of the input is signal IN is amplified by the conventional level shift circuit shown in FIG. 12. (It is to be noted that a potential difference between the positive power voltage $V_{DD}$ and the negative power voltage GND is set higher than the amplitude of the input signal IN).

If the conventional level shift circuit shown in FIG. 12 is constructed of polysilicon similarly to the other drive circuit, then the threshold voltage of each transistor becomes higher than the voltage formed by single crystal silicon. During the processes of forming transistors, it is sometimes the case where variation in threshold voltage increases. The rise in transistor threshold voltage leads to an increase in transistor ON-state resistance. If the ON-state resistances of the p-channel TFT's p121 and p122 and the n-channel TFT's n121 and n122 become high, then a time constant of charging and discharging the input terminal of the inverter circuit section constructed of the p-channel TFT p123 and the n-channel TFT n123 is increased. In contrast to this, the amplitudes of the start pulses SPV and SPH and the clock signals φ1V, φ2V, φ1H and φ2H, which have logic level power voltages of 3 V, 3.3 V and 5 V, are not regarded as sufficiently high. This has led to the problem that the waveform of an output from the level shift circuit has become dull or distorted.

In view of the above, it can be considered to increase the transistor channel width in order to reduce the time constant. However, if the transistor channel width is increased, then this leads to the increase in area of the level shift circuit. Furthermore, if the transistor channel width is increased, then the capacity of the transistor itself concurrently increases. Therefore, even if the transistor channel width is increased, then the effect of reducing the time constant is not proportional to the size of the transistor channel width.

As a technique for solving the above-mentioned problem, for example, Japanese Patent Laid-Open Publication No. HEI 4-242317 and the like are proposed. FIG. 13 shows the conventional level shift circuit disclosed in this Japanese Patent Laid-Open Publication No. HEI 4-242317. FIG. 13 shows a positive power voltage $V_B$, resistors $R_{131}$ and $R_{132}$, capacitors $C_{131}$ and $C_{132}$, npn-type bipolar transistors $T_{131}$ and $T_{132}$, p-channel TFT's p131, p132 and p133, n-channel TFT's n131, n132 and n133 and other components similar to those of FIG. 12.

FIG. 13 is constituted by a voltage clamp circuit section constructed of the positive power voltage $V_B$, negative power voltage GND, resistors $R_{131}$ and $R_{132}$ and npn-type bipolar transistors $T_{131}$ and $T_{132}$, and a level shift circuit section constructed of the positive power voltage $V_{DD}$, negative power voltage GND, p-channel TFT's p131, p132 and p133 and n-channel TFT's n131, n132 and n133. In the voltage clamp circuit section, a voltage obtained by dividing the voltage across the positive power voltage $V_B$ and the negative power voltage GND by the resistors $R_{131}$ and $R_{132}$ (this voltage defined as a voltage $V_B'$) is inputted to the base of the npn-type bipolar transistor $T_{131}$ and the base of the transistor $T_{132}$. The emitter of the npn-type bipolar transistor $T_{132}$ is connected to one electrode of the capacitor $C_{131}$ and the gate of the n-channel TFT n131. The emitter of the npn-type bipolar transistor $T_{131}$ is connected to one electrode of the capacitor $C_{132}$ and the gate of the n-channel TFT n132. The collector of the npn-type bipolar transistor $T_{131}$ and the collector of the transistor $T_{132}$ are connected to the positive power voltage $V_B$. It is to be noted that the level shift circuit section has the same construction as that of the conventional level shift circuit shown in FIG. 12.

Reference is made to the operation of the conventional level shift circuit shown in FIG. 13. An input signal IN is capacitively coupled with the capacitor $C_{131}$ and inputted to the gate of the n-channel TFT n131, while an input signal (/IN) is capacitively coupled with the capacitor $C_{132}$ and inputted to the gate of the n-channel TFT n132. In this case, due to a voltage from the voltage clamp circuit section, the input signals IN and (/IN), of which the amplitudes are not changed, have their low levels shifted to voltages dropped by the forward voltage from the voltage $V_B'$. That is, even when the threshold voltages of the transistors that constitute the level shift circuit section become high, then the high levels of the input signals IN and (/IN) can be set higher than the respective threshold voltages, allowing the transistors to be correctly turned on and off. Then, the level shift circuit section amplifies the amplitude of the input signal IN similarly to the conventional level shift circuit shown in FIG. 12.

However, the above-mentioned level shift circuit has had the problem that the circuit needs the two input signals of the input signals IN and (/IN) that have a relation of inverted voltage levels. That is, if the driver monolithic type TFT liquid crystal display device shown in FIG. 11 has the aforementioned level shift circuit built-in, then, with regard to the start pulses SPV and SPH, the input control signals are not required to have the relation of inverted voltage levels in terms of driving the shift registers 3 and 4, but the level shift circuit needs two input control signals having the relation of inverted voltage levels. This leads to an increase in the number of external input signals when forming the driver monolithic type TFT liquid crystal display device and consequently leads to an increase in the number of connection terminals for the external signals.

The aforementioned level shift circuit, in which the voltage clamp circuit section is constructed of the npn-type bipolar transistors $T_{131}$ and $T_{132}$, has had the problem that it is hard to monolithically form the level shift circuit of polysilicon on the same substrate as that of the drive circuit. That is, the voltage clamp circuit is required to be externally provided, causing an increase in the number of components.

Furthermore, the aforementioned level shift circuit has had the problem that, when the threshold voltages of the p-channel TFT's p131, p132 and p133 and the n-channel TFT's n131, n132 and n133 constituting the level shift circuit fluctuate, the voltage $V_B$, is required to be adjusted according to the threshold voltages of the transistors. That is, the positive power voltage $V_B$ or the resistors $R_{131}$ and $R_{132}$ must be adjusted in value according to the threshold voltages of the transistors. In general, the variation in the threshold voltages of the transistors formed of polysilicon is greater than that of the transistors formed of single crystal silicon, and it is very inefficient to adjust the voltage $V_B$ every liquid crystal display device when putting mass production into practice.

SUMMARY OF THE INVENTION

The present invention has been made to solve the aforementioned problems and provides a level shift circuit and an image display device that operate with one input signal, allow the whole level shift circuit to be monolithically formed of polysilicon on a substrate identical to that of a drive circuit and are not required to have the power voltage and resistance values adjusted for each liquid crystal display device.

In order to solve the above problems, there is provided a level shift circuit having a capacitance means provided for an input section, a bias voltage setting means for setting a DC voltage level of an input signal capacitively coupled with the capacitance means and an amplifying means for amplifying the amplitude of the input signal of which the DC voltage level is set, the bias voltage setting means being constituted by providing a voltage dividing means between a positive power voltage and a negative power voltage and the amplifying means having one input signal line.

Also, there is provided an image display device employing a level shift circuit provided with a capacitance means provided for an input section, a bias voltage setting means for setting a DC voltage level of an input signal capacitively coupled with the capacitance means and an amplifying means for amplifying the amplitude of the input signal, the bias voltage setting means being constituted by providing a voltage dividing means between a positive power voltage and a negative power voltage, and the amplifying means having one input signal line.

According to the above level shift circuit and image display device, the bias voltage setting means is constituted by providing the voltage dividing means between the positive power voltage and the negative power voltage. Therefore, the bias voltage setting means can be provided by a simple circuit construction, and the DC voltage level of the input signal can be easily shifted into the range of the operating point of the amplifying means. The input terminal of the amplifying means is constructed of one terminal. Therefore, the level shift circuit is allowed to have a reduced number of input signal lines, and the amplifying means can be provided by a simple circuit construction.

In one embodiment of the present invention, the amplifying means is a CMOS inverter circuit.

According to the above embodiment, the amplifying means is the CMOS inverter circuit. With this arrangement, the amplifying means can be provided by a simple structure employing the p-channel transistor and the n-channel transistor.

In one embodiment of the present invention, a p-channel transistor and an n-channel transistor are employed as the voltage dividing means.

According to the above embodiment, the p-channel transistor and the n-channel transistor are employed as the voltage dividing means. Therefore, the DC voltage level of the input signal can be easily set by the ON-state resistance ratio of the transistors. The level shift circuit can be entirely formed of polysilicon, which has a greater threshold voltage variation than single crystal silicon, on an identical substrate. That is, a driver monolithic type image display device including a level shift circuit can be provided.

In one embodiment of the present invention, capacitors are employed as the voltage dividing means.

According to the above embodiment, the capacitors are employed as the voltage dividing means. Therefore, the DC voltage level of the input signal can be easily set by the areal ratio of the capacitors. The capacitors can also be easily formed on the polysilicon, and therefore, the level shift circuit can be entirely formed on an identical substrate. That is, a driver monolithic type image display device including the level shift circuit can be provided.

In one embodiment of the present invention, resistors are employed as the voltage dividing means.

According to the above embodiment, the resistors are employed as the voltage dividing means. Therefore, the DC voltage level of the input signal can be easily set by the resistance ratio, and the level shift circuit can be entirely formed on an identical substrate. That is, a driver monolithic type image display device including the level shift circuit can be provided.

In one embodiment of the present invention, the bias voltage setting means is constructed so that a source of the p-channel transistor and a gate of the n-channel transistor are connected to the positive power voltage, a gate of the p-channel transistor and a source of the n-channel transistor are connected to the negative power voltage, and a drain of the p-channel transistor and a drain of the n-channel transistor are connected to an input terminal of the amplifying means.

According to the above embodiment, the bias voltage setting means is constructed so that the source of the p-channel transistor and the gate of the n-channel transistor are connected to the positive power voltage, the gate of the p-channel transistor and the source of the n-channel transistor are connected to the negative power voltage, and the drain of the p-channel transistor and the drain of the n-channel transistor are connected to the input terminal of the amplifying means. With this arrangement, even if the threshold voltages of the transistors constituting the level shift circuit fluctuate to shift the operating point of the amplifying means, then the DC voltage level of the input signal can be automatically set in response to the shift.

In one embodiment of the present invention, the bias voltage setting means is constructed so that a source of a p-channel transistor is connected to the positive power voltage, a source of an n-channel transistor is connected to the negative power voltage, and a gate and a drain of a p-channel transistor and a gate and a drain of an n-channel transistor are connected to an input terminal of the amplifying means.

According to the above embodiment, the bias voltage setting means is constructed so that the source of the p-channel transistor is connected to the positive power voltage, the source of the n-channel transistor is connected to the negative power voltage, and the gate and the drain of the p-channel transistor and the gate and the drain of the n-channel transistor are connected to the input terminal of the amplifying means. With this arrangement, even if the threshold voltages of the transistors constituting the level shift circuit fluctuate to shift the operating point of the amplifying means, then the DC voltage level of the input signal can be easily set.

In one embodiment of the present invention, the voltage dividing means is constructed of a plurality of p-channel transistors and a plurality of n-channel transistors.

According to the above embodiment, the voltage dividing means is constructed of the plurality of p-channel transistors and the plurality of n-channel transistors. With this arrangement, stress exerted by the electric fields applied across the source and drain of each transistor can be reduced. The DC voltage level of the input signal can be determined by the number of transistors, and this allows the degree of freedom of setting to be increased.

In one embodiment of the present invention, a. level shift circuit further comprises a voltage clamping means for clamping the DC voltage level set by the bias voltage setting means.

According to the above embodiment, the level shift circuit and the image display device of the present invention are provided with the voltage clamping means for clamping the DC voltage level set by the bias voltage setting means. With this arrangement, the waveform distortion of the input signal can be prevented regardless of the frequency of the input signal, the transistors constituting the bias voltage setting means and the capacitance means provided for the input section. This also allows the degree of freedom of setting to be increased.

In one embodiment of the present invention, a level shift circuit further comprises a means for compensating for a voltage drop when the DC voltage level set by the bias voltage setting means are clamped by the voltage clamping means.

According to the above embodiment, the level shift circuit of the present invention is provided with the means for compensating for the voltage drop when the DC voltage level set by the bias voltage setting means is clamped by the voltage clamping means. With this arrangement, the DC voltage level of the input signal can be easily set by the bias voltage setting means.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of the present invention will be described below.

(First Embodiment)

Figure 1:
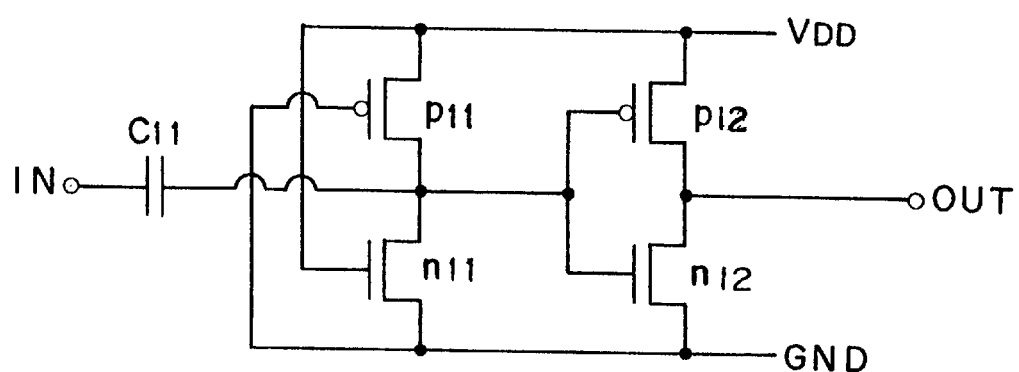
FIG. 1 is a diagram showing a level shift circuit according to a first embodiment of the present invention.

FIG. 1 shows a level shift circuit for use in an image display device according to the first embodiment of the present invention. FIG. 1 shows a positive power voltage $V_{DD}$, a negative power voltage GND, an input signal IN, an output signal OUT, a capacitor $C_{11}$, p-channel TFT's p11 and p12 and n-channel TFT's n11 and n12.

The circuit shown in FIG. 1 is constituted by a bias voltage setting section constructed of the positive power voltage $V_{DD}$, negative power voltage GND, p-channel TFT p11 and the n-channel TFT n11 and an amplifier circuit section constructed of the positive power voltage $V_{DD}$, negative power voltage GND, p-channel TFT p12 and n-channel TFT n12. In the bias voltage setting section, the drain of the p-channel TFT p11 is connected to the drain of the n-channel TFT n11 and one electrode of the capacitor $C_{11}$, while the source of the p-channel TFT p11 and the gate of the n-channel TFT n11 are connected to the positive power voltage $V_{DD}$, while the gate of the p-channel TFT p11 and the source of the n-channel TFT n11 are connected to the negative power voltage GND. In the amplifier circuit section, the gate of the p-channel TFT p12 is connected to the gate of the n-channel TFT n12 and the one electrode of the capacitor $C_{11}$ (serving as the input terminal of the amplifier circuit section). The drain of the p-channel TFT p12 and the drain of the n-channel TFT n12 are connected to each other (serving as the output terminal of the amplifier circuit section). The source of the p-channel TFT p12 is connected to the positive power voltage $V_{DD}$, while the source of the n-channel TFT n12 is connected to the negative power voltage GND.

Reference is made to the operation of the level shift circuit of the first embodiment of the present invention shown in FIG. 1. The input signal IN is capacitively coupled with the capacitor $C_{11}$ and inputted to the input terminal of the amplifier circuit section. In this case, depending on a bias voltage determined on an ON-state resistance ratio between the p-channel TFT p11 and the n-channel TFT n11 (this voltage being defined as Vb), the voltage level of swing of the input signal IN is shifted to the bias voltage Vb although the amplitude does not change. That is, by correctly setting the bias voltage Vb, the amplifier circuit section can be normally operated. Then, in the amplifier circuit section, the p-channel TFT p12 is turned off and the n-channel TFT n12 is turned on when the input signal IN has high level, as a consequence of which the negative power voltage GND is outputted from the output terminal of the amplifier circuit section. The p-channel TFT p12 is turned on and the n-channel TFT n12 is turned off when the input signal IN has low level, as a consequence of which the positive power voltage $V_{DD}$ is outputted from the output terminal of the amplifier circuit section. That is, the amplitude of the input signal IN is amplified by the level shift circuit of the first embodiment of the present invention shown in FIG. 1 (note that the potential difference between the positive power voltage $V_{DD}$ and the negative power voltage GND is set higher than the amplitude of the input signal IN).

Figure 2:
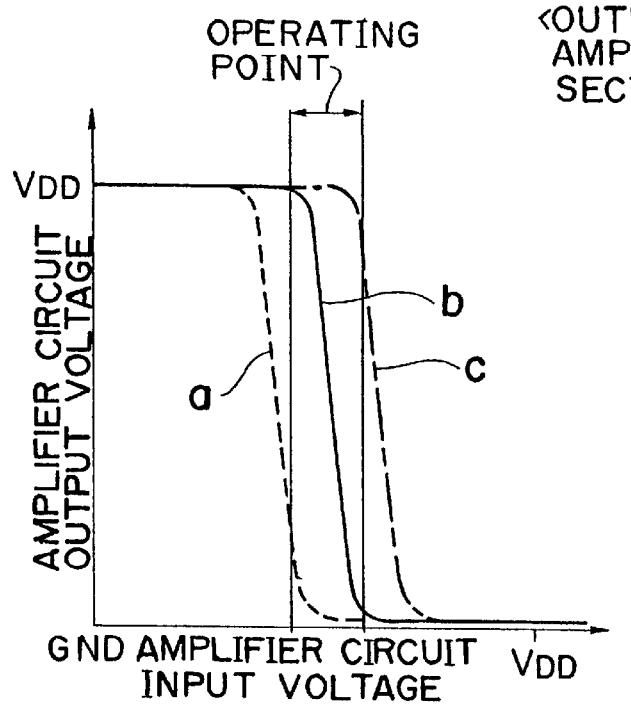
FIG. 2 is a diagram showing a relation between an input and an output of the level shift circuit of the first embodiment of the present invention.
Figure 2:
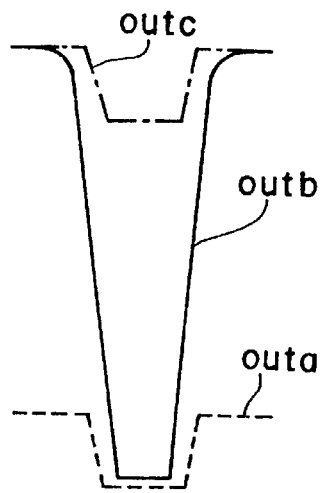
Figure 2:
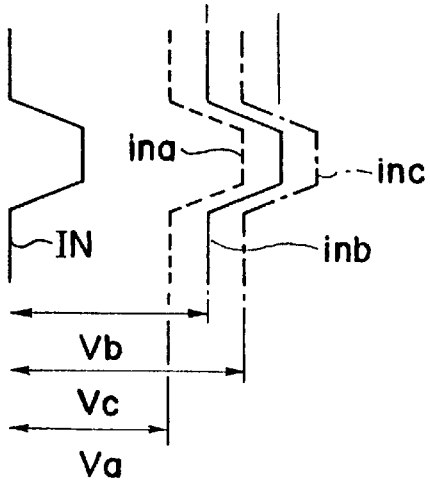

FIG. 2 shows a relation between the input and output of the level shift circuit in the first embodiment of the present invention. The voltage level of swing of the input signal IN is shifted to the bias voltage Vb so as to become a signal inb and inputted to the input terminal of the amplifier circuit section. If the input-to-output voltage characteristic of the amplifier circuit section has a characteristic curve of the waveform b and the amplitude of the signal inb has an input voltage operating range such that the output voltage of the amplifier circuit section is inverted from the positive power voltage $V_{DD}$ to the negative power voltage GND, then a signal outb is outputted from the output terminal of the amplifier circuit section.

In this case, if the absolute value of the threshold voltage of the p-channel TFT constituting the level shift circuit becomes smaller than the absolute value of the threshold voltage of the n-channel TFT, then the input-to-output voltage characteristic of the amplifier circuit section comes to have a characteristic curve of the waveform c, and the operating point is shifted to the positive power voltage $V_{DD}$ side. In this case, if the signal to be inputted to the input terminal of the amplifier circuit section remains the signal inb, then a signal outc is outputted from the output terminal of the amplifier circuit section, meaning that sufficient amplitude conversion is not effected. However, if the absolute value of the threshold voltage of the p-channel TFT becomes smaller than the absolute value of the threshold voltage of the n-channel TFT, then the ON-state resistance value of the p-channel TFT p11 becomes smaller than the ON-state resistance value of the n-channel TFT n11. Therefore, the bias voltage determined by the bias voltage setting section is shifted from Vb to the positive power voltage $V_{DD}$ side to become Vc, and the signal to be inputted to the input terminal of the amplifier circuit section becomes a signal inc. As a result, the signal outb is outputted from the output terminal of the amplifier circuit.

Conversely to the above, if the absolute value of the threshold voltage of the p-channel TFT constituting the level shift circuit becomes greater than the absolute value of the threshold voltage of the n-channel TFT, then the input-to-output voltage characteristic of the amplifier circuit section comes to have a characteristic curve of the waveform a, and the operating point is shifted to the negative power voltage GND side. In this case, the ON-state resistance value of the p-channel TFT p11 becomes greater than the ON-state resistance value of the n-channel TFT n11. Therefore, the bias voltage determined by the bias voltage setting section is shifted from Vb to the negative power voltage GND side to become Va, and the signal to be inputted to the input terminal of the amplifier circuit section becomes a signal ina. As a result, the signal outb is outputted from the output terminal of the amplifier circuit section instead of a signal outa.

That is, in the level shift circuit of the first embodiment of the present invention, even if the threshold voltages of the transistors constituting the level shift circuit fluctuate to shift the operating point of the amplifier circuit section, then the bias voltage is automatically set by the bias voltage setting section in response to the shift.

Although the bias voltage setting section is constructed of one p-channel TFT and one n-channel TFT in the level shift circuit of the first embodiment of the present invention shown in FIG. 1, either or both of the p-channel TFT and the n-channel TFT may be constructed of two or more elements.

Figure 3:
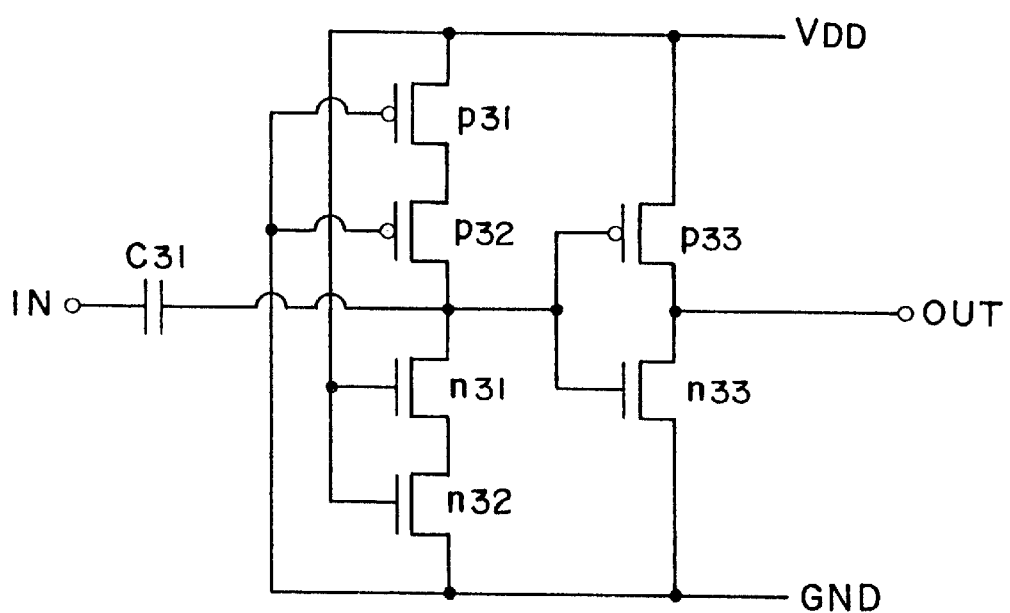
FIG. 3 is a diagram showing another example of the level shift circuit of the first embodiment of the present invention.

FIG. 3 shows another example of the level shift circuit of the first embodiment of the present invention. FIG. 3 shows a capacitor $C_{31}$, p-channel TFT's p31, p32 and p33, n-channel TFT's n31, n32 and n33 and other components similar to those of FIG. 1.

The circuit of FIG. 3 differs from the level shift circuit of the first embodiment of the present invention shown in FIG. 1 in that the bias voltage setting section is constructed of two p-channel TFT's and two n-channel TFT's. With this arrangement, the voltages applied across the terminals of each transistor can be reduced, and therefore, the effect of reducing the stress due to the electric field applied across the source and drain of each transistor can be expected. The bias voltage can be determined by the quantitative ratio between the p-channel TFT's and the n-channel TFT's, increasing the degree of freedom of setting the bias voltage.

(Second Embodiment)

Figure 4:
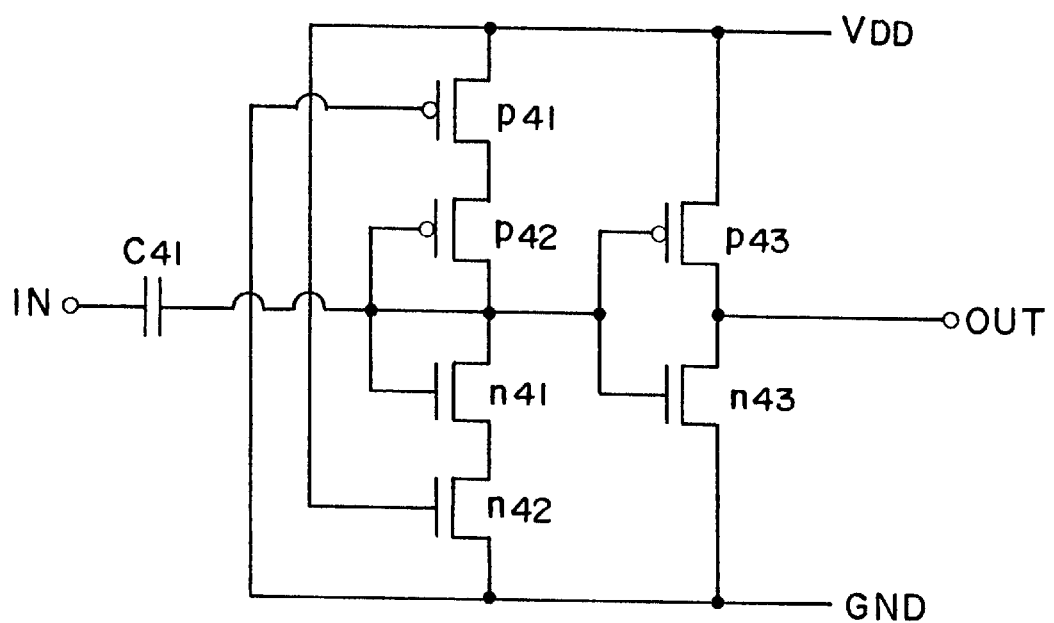
FIG. 4 is a diagram showing a level shift circuit according to a second embodiment of the present invention.

FIG. 4 shows a level shift circuit to be used for an image display device according to the second embodiment of the present invention. FIG. 4 shows a capacitor $C_{41}$, p-channel TFT's p41, p42 and p43, n-channel TFT's n41, n42 and n43 and other components similar to those of FIG. 1.

The circuit of FIG. 4 differs from the level shift circuit of the first embodiment of the present invention shown in FIG. 3 in that the gate of the p-channel TFT p42 and the gate of the n-channel TFT n41 constituting the bias voltage setting section are connected to each other and the drain of the p-channel TFT p42 and the drain of the n-channel TFT n41 are connected to each other.

In the level shift circuit of the first embodiment shown in FIG. 2 and FIG. 3, the quantity of shift of the operating point of the amplifier circuit section due to the fluctuations in threshold voltage of the transistors and the direction of shift of the bias voltage from the bias voltage setting section exhibit coincidence. However, in general, the quantity of shift of the bias voltage becomes greater than the operating point of the amplifier circuit section. Accordingly, if the quantity of shift of the bias voltage becomes too large, then it is possible that the amplitude of the input signal IN might deviate from the range of operating point of the amplifier circuit section. On the other hand, in the level shift circuit of the second embodiment of the present invention shown in FIG. 4, the bias voltage from the bias voltage setting section is fed back to the gate of the p-channel TFT p42 and the gate of the n-channel TFT n41, allowing the quantity of shift of the bias voltage due to the fluctuations in threshold voltage of the transistors can be compensated for.

The compensation effect will be described in detail. If the absolute value of the threshold voltage of the p-channel TFT that constitutes the level shift circuit becomes smaller than the absolute value of the threshold voltage of the n-channel TFT, then the ON-state resistance values of the p-channel TFT's p41 and p42 become smaller than the ON-state resistance values of the n-channel TFT's n41 and n42. Therefore, the bias voltage is shifted to the positive power voltage $V_{DD}$ side. However, the bias voltage from the bias voltage setting section is fed back to the gate of the p-channel TFT p42 and the gate of the n-channel TFT n41, and therefore, the bias voltage shifted to the positive power voltage $V_{DD}$ side operates so as to reduce the ON-state resistance value of the n-channel TFT n41. As a result, the quantity of shift of the bias voltage becomes smaller than that of the level shift circuit of the first embodiment shown in FIG. 2 and FIG. 3. Conversely to the above, if the absolute value of the threshold voltage of the p-channel TFT constituting the level shift circuit becomes greater than the absolute value of the threshold voltage of the n-channel TFT, then the bias voltage, which is shifted to the negative power voltage GND side, operates so as to reduce the ON-state resistance value of the p-channel TFT p42. As a result, similar to the aforementioned case, the quantity of shift of the bias voltaae becomes smaller than that of the level shift circuit of the first embodiment shown in FIG. 2 and FIG. 3.

That is, in the level shift circuit of the second embodiment of the present invention, if the threshold voltages of the transistors constituting the level shift circuit fluctuate to shift the operating point of the amplifier circuit section, then the bias voltage from the bias voltage setting section can be easily set in accordance with the quantity of shift of the amplifier circuit section.

Although the bias voltage setting section is constructed of two p-channel TFT's and two n-channel TFT's in the level shift circuit of the second embodiment of the present invention shown in FIG. 4, either or both of the p-channel TFT's and the n-channel TFT's may be constructed of three or more elements. Either or both of the p-channel TFT's and the n-channel TFT's may also be constructed of one element. That is, there may be a construction in which either the p-channel TFT p41 or the n-channel TFT n42 is eliminated from the level shift circuit of the second embodiment of the present invention shown in FIG. 4.

(Third Embodiment)

Figure 5:
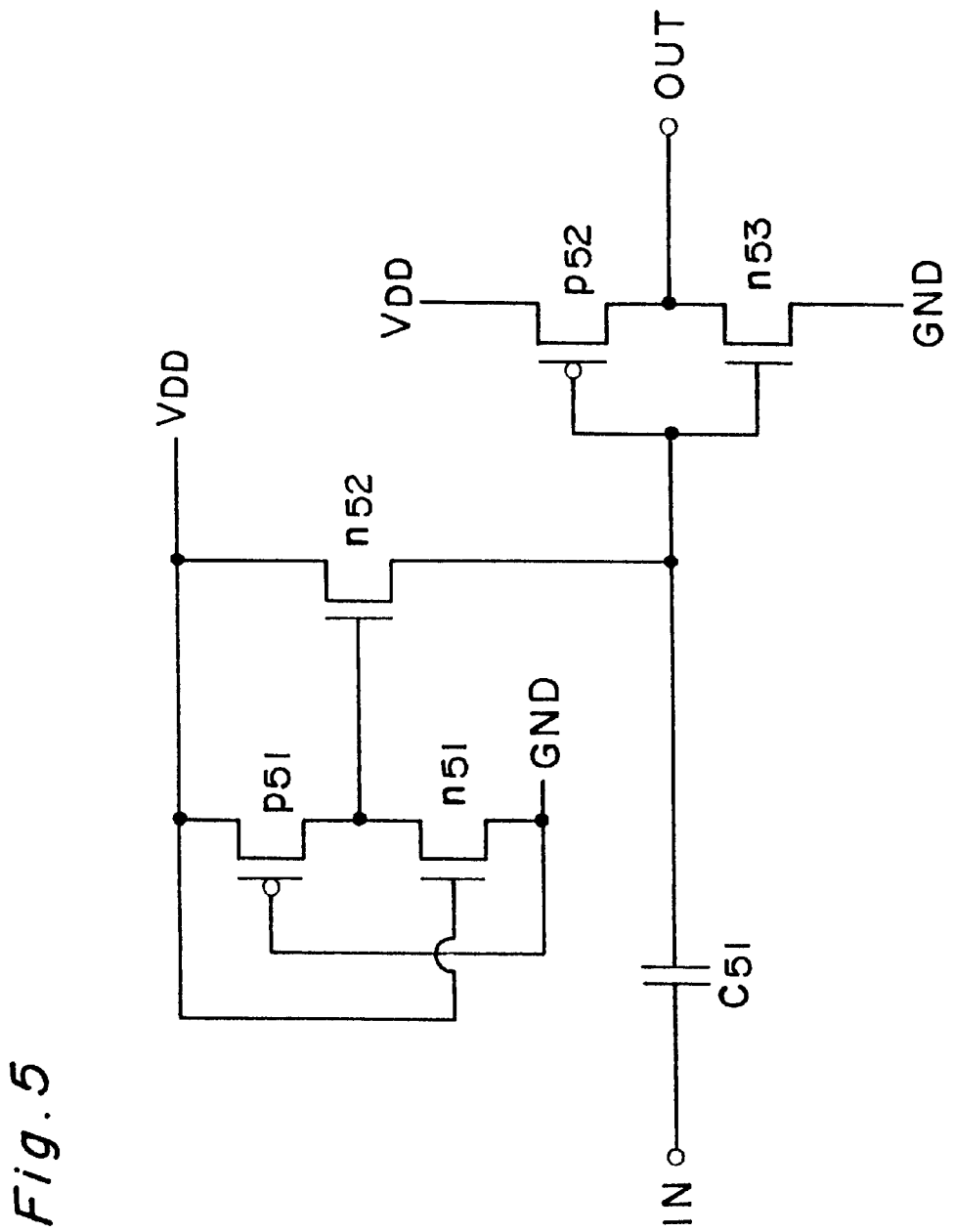
FIG. 5 is a diagram showing a level shift circuit according to a third embodiment of the present invention.

FIG. 5 shows a level shift circuit to be used for an image display device according to the third embodiment of the present invention. FIG. 5 shows a capacitor $C_{51}$, p-channel TFT's p51 and p52, n-channel TFT's n51, n52 and n53 and other components similar to those of FIG. 1.

The circuit of FIG. 5 differs from the level shift circuit of the first embodiment of the present invention shown in FIG. 1 in that an n-channel TFT n52 for voltage clamping is provided between the output terminal of the bias voltage setting section and the input terminal of the amplifier circuit section. The drain of the n-channel TFT n52 is connected to the gate of a p-channel TFT p52 and the gate of an n-channel TFT n53 serving as the input terminal of the amplifier circuit section and connected to one electrode of the capacitor $C_{51}$. The gate of the n-channel TFT n52 is connected to the drain of a p-channel TFT p51 and the drain of an n-channel TFT n51 serving as the output terminal of the bias voltage setting section, while the source of the n-channel TFT n52 is connected to the positive power voltage $V_{DD}$.

In the level shift circuit of the first embodiment of the present invention shown in FIG. 1 and FIG. 3 and the level shift circuit of the second embodiment of the present invention shown in FIG. 4, the capacitor impedance is required to be made sufficiently lower than the ON-state resistance value of each of the p-channel TFT and the n-channel TFT that constitute the bias voltage setting section. Considering the level shift circuit of the first embodiment of the present invention shown in FIG. 1, assuming that the frequency of the input signal IN is fHz, the ON-state resistance of the p-channel TFT p11 is $Rp_{11}$, the ON-state resistance of the n-channel TFT n11 is $Rn_{11}$, the capacity of the capacitor $C_{11}$ is $C_{11}$, then the impedance $Zc_{11}$ of the capacitor $C_{11}$ becomes $Zc_{11}=1/(2\pi \cdot C_{11})$. It is required to make the following relational expression:

$$1/(2\pi \cdot f C_{11}) << Rp_{11}, Rn_{11}$$

hold. Otherwise, the signal waveform becomes distorted at the input terminal of the amplifier circuit section, and the level shift circuit does not correctly operate.

If the frequency fHz of the input signal IN is changed to f/10 Hz, in order to satisfy the aforementioned relational expression, then the value of the capacitor $C_{11}$ is required to be ten times the value, and the values of the ON-state resistance $Rp_{11}$ of the p-channel TFT p11 and the ON-state resistance $Rn_{11}$ of the n-channel TFT n11 are required to be ten times the values. That is, in order to sufficiently increase the ratio between the impedance $Zc_{11}$ of the capacitor $C_{11}$ at the frequency of the input signal IN and the ON-state resistances of the transistors of the bias voltage setting section, it is required to increase the capacitance by increasing the size of the capacitor or increase the ON-state resistance of the transistor by increasing the number of transistors that constitute the bias voltage setting section. However, increasing the size of the capacitor and increasing the number of transistors are not always preferable since they lead to the increase in scale of the level shift circuit. In order to increase the ON-state resistance $Rp_{11}$ of the p-channel TFT p11 and the ON-state resistance $Rn_{11}$ of the n-channel TFT n11, a method for adjusting the transistor size can also be considered. However, taking the design rule of the transistors into consideration, it is difficult to make the value of the ON-state resistance of the transistor not smaller than a specified value.

On the other hand, in the level shift circuit according to the third embodiment of the present invention shown in FIG. 5, the low level of the input signal IN is shifted from the voltage set by the ratio between the ON-state resistance of the p-channel TFT p51 and the ON-state resistance of the n-channel TFT n51 to a voltage V' dropped by the threshold voltage of the n-channel TFT n52. If the circuit operates with the low level of the input signal IN reducing to a voltage lower than the voltage V', then the gate of the p-channel TFT p52, the gate of the n-channel TFT n53 and the capacitor $C_{51}$ are to be charged via the n-channel TFT n52, and consequently the voltage is clamped at the voltage V' without becoming lower than the voltage V'. Then, it is proper to set the low level of the input signal, i.e., the voltage V' so that the amplitude of the input signal IN falls within the range of the operating point of the amplifier circuit section.

That is, according to the level shift circuit of the third embodiment of the present invention, by clamping the low level voltage of the input signal, the input signal is inputted to the amplifier circuit section without waveform distortion. This obviates the need for the adjustment of the ON-state resistance values of the p-channel TFT and the n-channel TFT that constitute the bias voltage setting section and the adjustment of the capacitance of the capacitor, consequently increasing the degree of freedom of designing.

Figure 6:
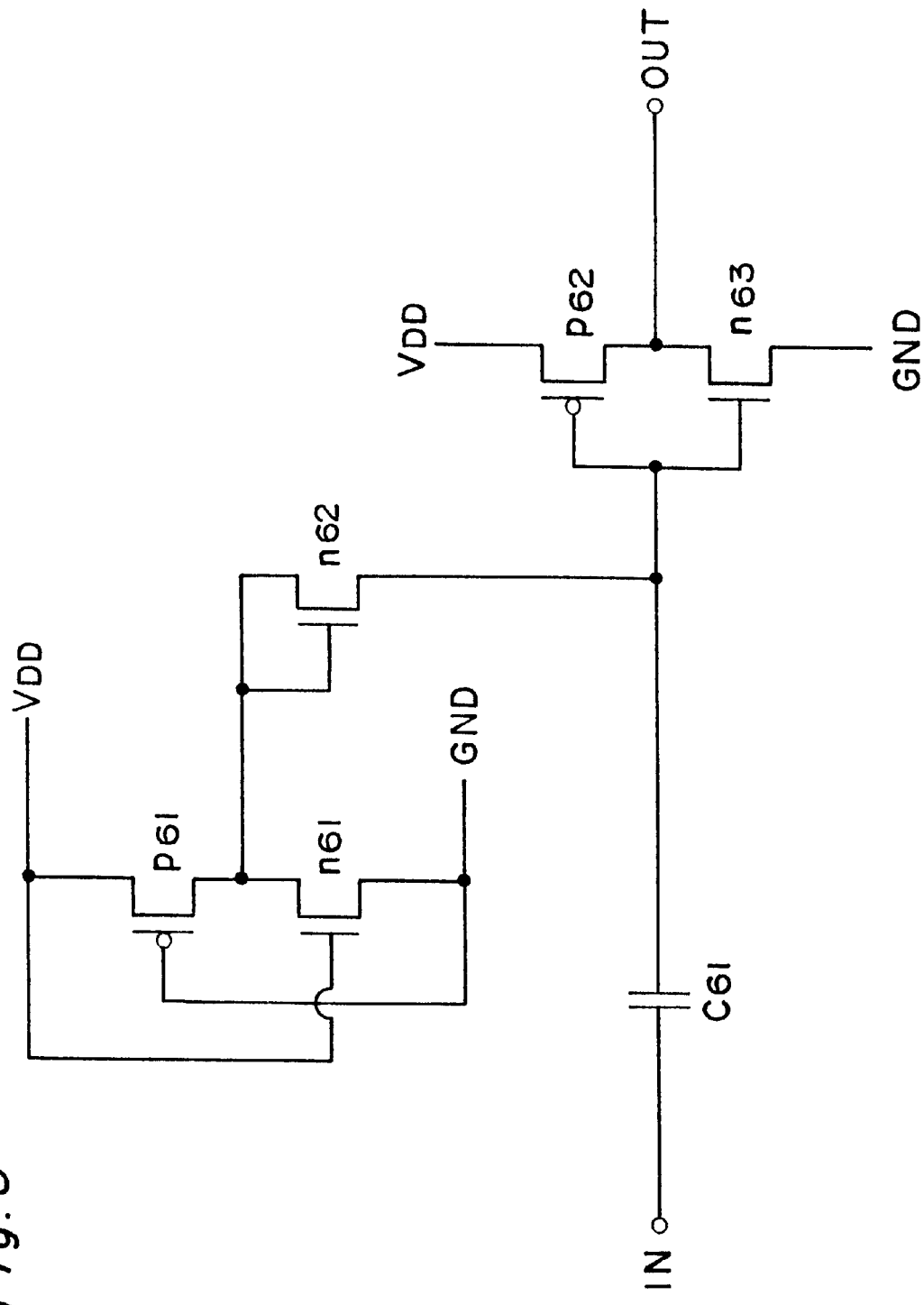
FIG. 6 is a diagram showing another example of the level shift circuit of the third embodiment of the present invention.

FIG. 6 shows another example of the level shift circuit of the third embodiment of the present invention. FIG. 6 shows a capacitor $C_{61}$, p-channel TFT's p61 and p62, n-channel TFT's n61, n62 and n63 and other components similar to those of FIG. 1.

The circuit of FIG. 6 differs from the level shift circuit of the third embodiment of the present invention shown in FIG. 5 in that the gate and source of the n-channel TFT n62 for voltage clamping provided between the output terminal of the bias voltage setting section and the input terminal of the amplifier circuit section are connected to each other. With this arrangement, the n-channel TFT n62 functions as a diode, and the low level of the input signal IN is shifted from the voltage set by the ratio between the ON-state resistance of the p-channel TFT p61 and the ON-state resistance of the n-channel TFT n61 to a voltage dropped by the threshold voltage of the n-channel TFT n62.

Although the bias voltage setting section is constructed of one p-channel TFT and one n-channel TFT in the level shift circuit of the third embodiment of the present invention, either or both of the p-channel TFT and the n-channel TFT may be constructed of two or more elements.

Although the level shift circuit of the third embodiment of the present invention employs the n-channel TFT for voltage clamping use, a p-channel TFT may be employed instead.

(Fourth Embodiment)

Figure 7:
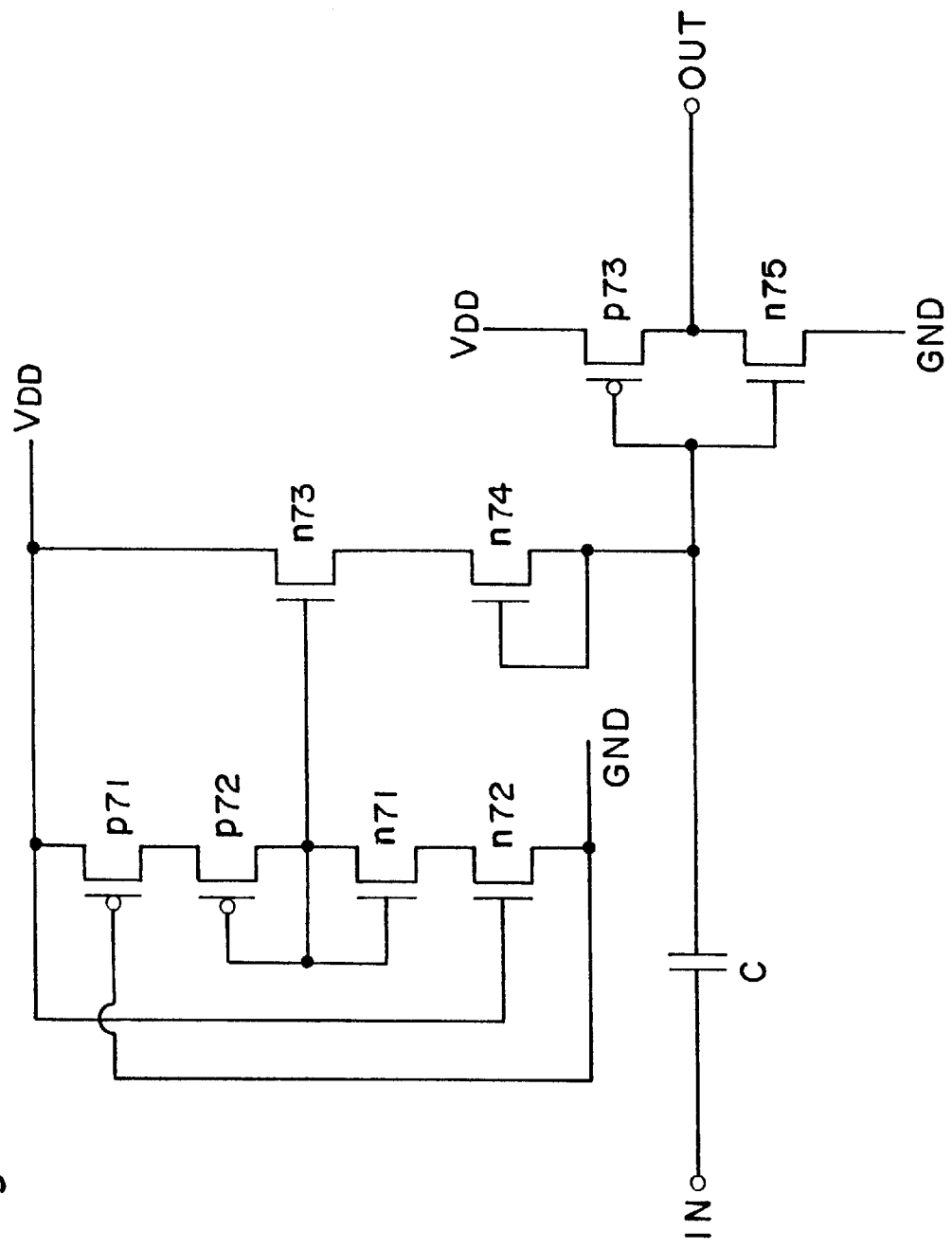
FIG. 7 is a diagram showing a level shift circuit according to a fourth embodiment of the present invention.

FIG. 7 shows a level shift circuit to be used for an image display device according to the fourth embodiment of the present invention. FIG. 7 shows a capacitor $C_{71}$, p-channel TFT's p71, p72 and p73, n-channel TFT's n71, n72, n73, n74 and n75 and other components similar to those of FIG. 1.

The circuit of FIG. 7 differs from the level shift circuit of the second embodiment of the present invention shown in FIG. 4 in that the n-channel TFT n73 and the n-channel TFT n74 for voltage clamping are provided between the output terminal of the bias voltage setting section and the input terminal of the amplifier circuit section. The drain of the n-channel TFT n73 is connected to the source of the n-channel TFT n74. The gate of the n-channel TFT n73 is connected to the gate of the p-channel TFT p72 and the gate of the n-channel TFT n71 and connected to the drain of the p-channel TFT p72 and the drain of the n-channel TFT n71. The source of the n-channel TFT n73 is connected to the positive power voltage $V_{DD}$. The gate and drain of the n-channel TFT n74 are connected to each other and further connected to the gate of the p-channel TFT p73, the gate of the n-channel TFT n75 and one electrode of the capacitor $C_{71}$ serving as the input terminal of the amplifier circuit section.

Here is considered the voltage clamping level of the level shift circuit of the fourth embodiment of the present invention shown in FIG. 7. As a bias voltage from the bias voltage setting section, a voltage dropped by the threshold voltage of the n-channel TFT n73 is outputted from the drain of the n-channel TFT n73. The gate and drain of the n-channel TFT n74 are connected to each other. Therefore, a voltage outputted from the drain of the n-channel TFT n73 is increased by the threshold voltage of the n-channel TFT n74.

That is, in the level shift circuit of the fourth embodiment of the present invention, by providing two transistors for voltage clamping use and making the second transistor compensate for the voltage dropped by the threshold voltage of the first transistor, the low level of the input signal can be clamped with the voltage set by the bias voltage setting section, and this allows the bias voltage to be easily set.

Although the bias voltage setting section of the level shift circuit of the fourth embodiment of the present invention has the same construction as that of the bias voltage setting section of the level shift circuit of the second embodiment of the present invention, the same construction as that of the bias voltage setting section of the level shift circuit of the first embodiment of the present invention may also be provided.

Although the bias voltage setting section is constructed of two p-channel TFT's and two n-channel TFT's in the level shift circuit of the fourth embodiment of the present invention, either or both of the p-channel TFT's and the n-channel TFT's may be constructed of three or more elements.

Although the level shift circuit of the fourth embodiment of the present invention employs the n-channel TFT for voltage clamping use, a p-channel TFT may be employed instead.

(Fifth Embodiment)

Figure 8:
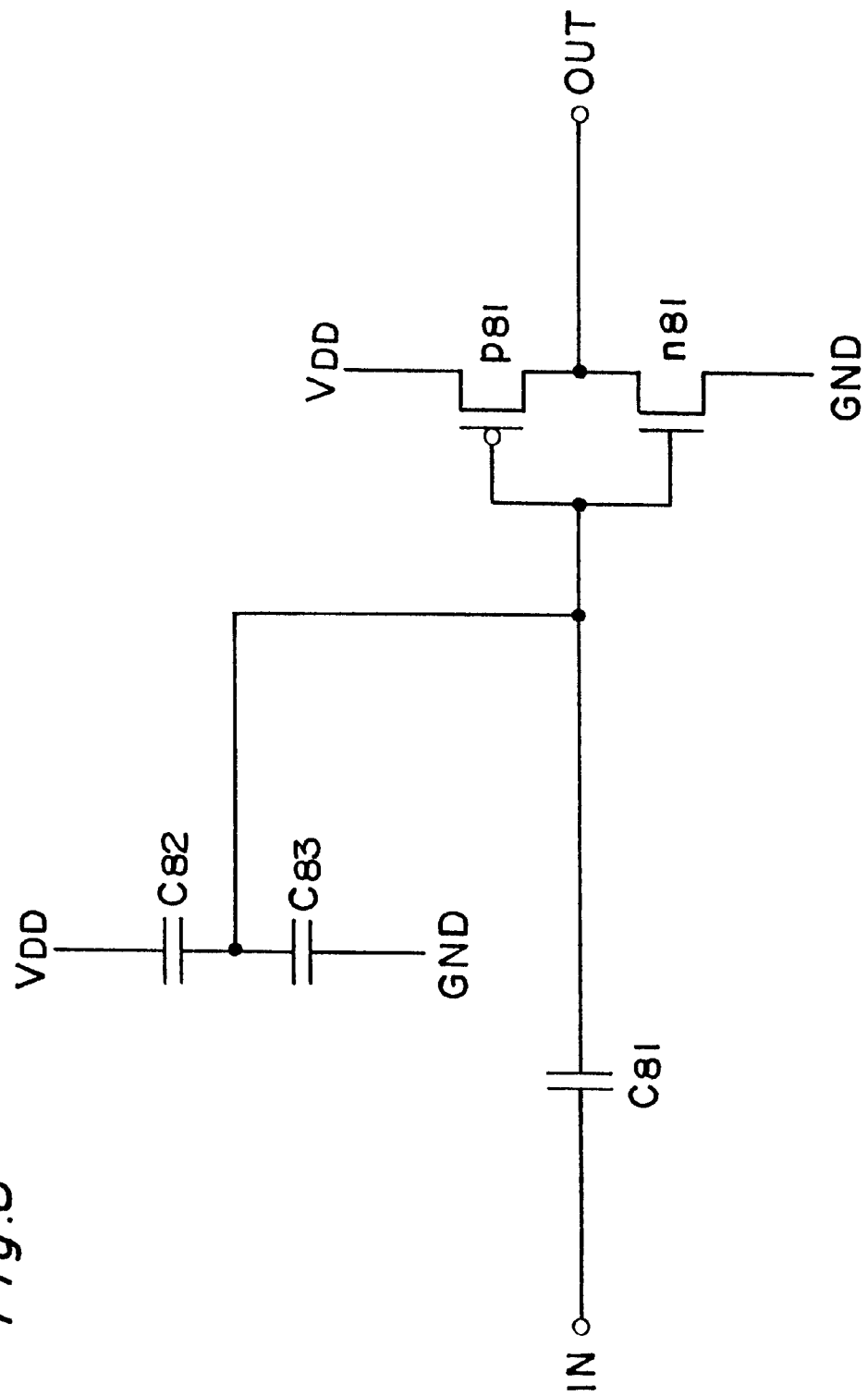
FIG. 8 is a diagram showing a level shift circuit according to a fifth embodiment of the present invention.
Figure 9:
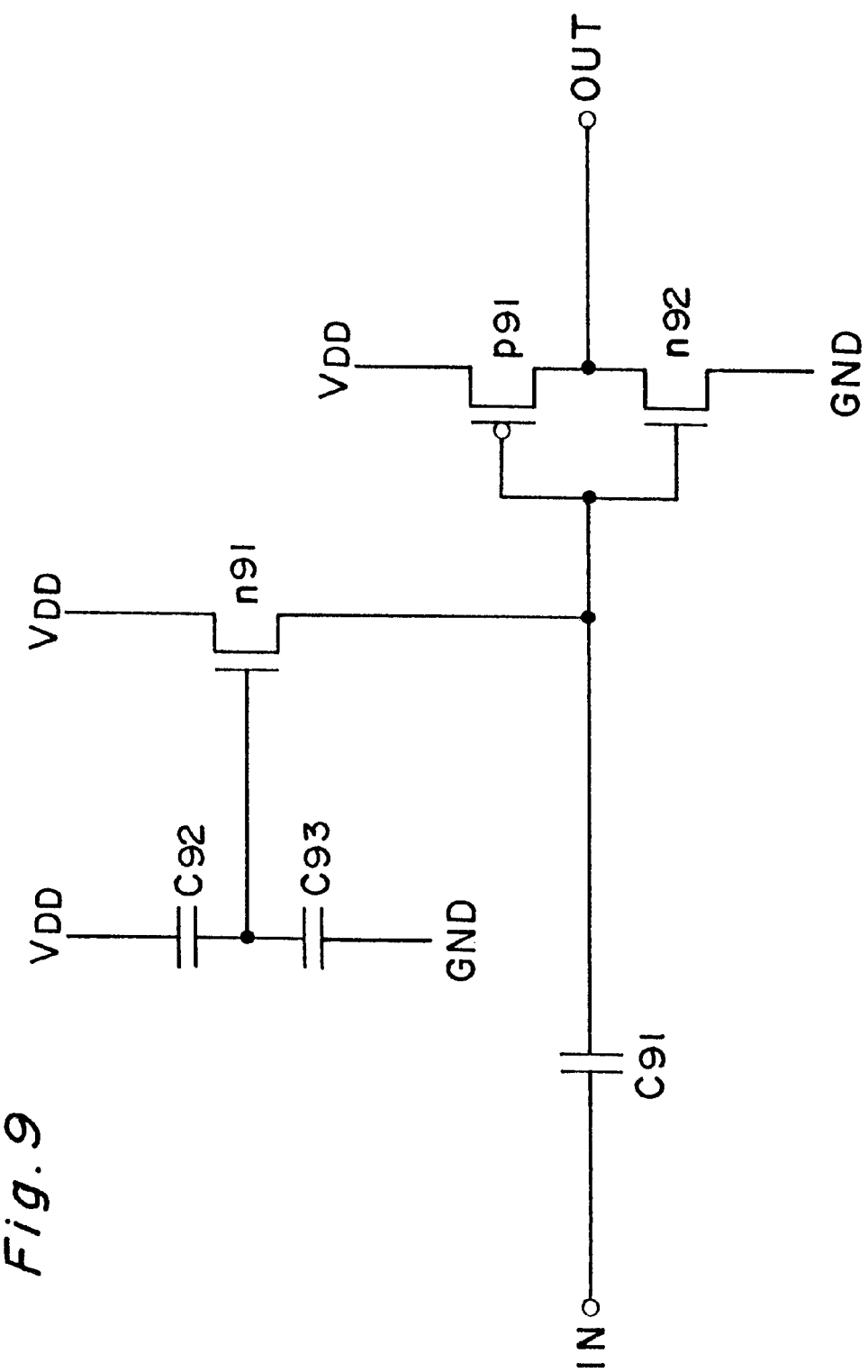
FIG. 9 is a diagram showing another example of the level shift circuit of the fifth embodiment of the present invention.
Figure 10:
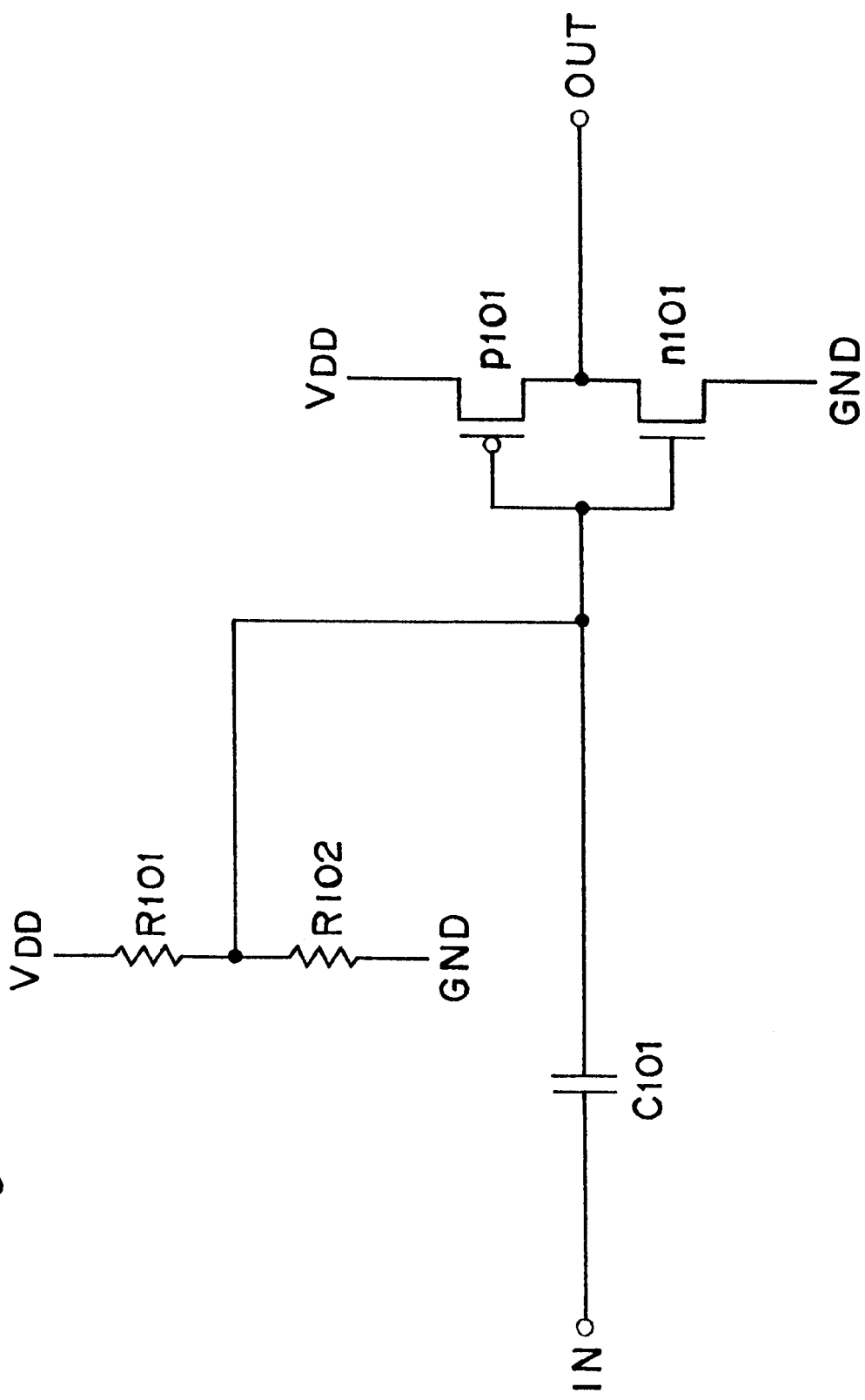
FIG. 10 is a diagram showing another example of the level shift circuit of the fifth embodiment of the present invention.
Figure 11:
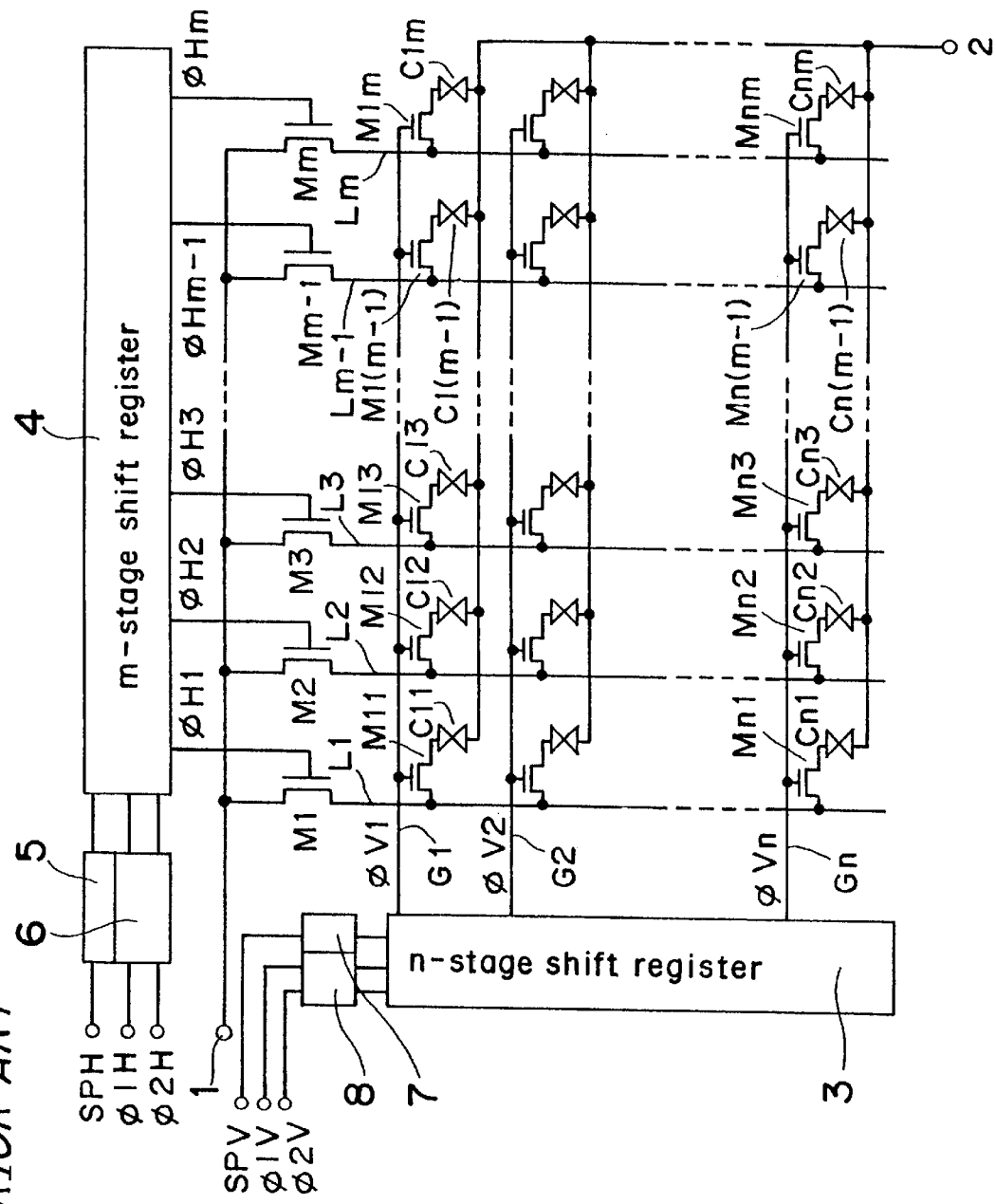
FIG. 11 is a diagram showing the construction of a driver monolithic type TFT liquid crystal display device.
Figure 12:
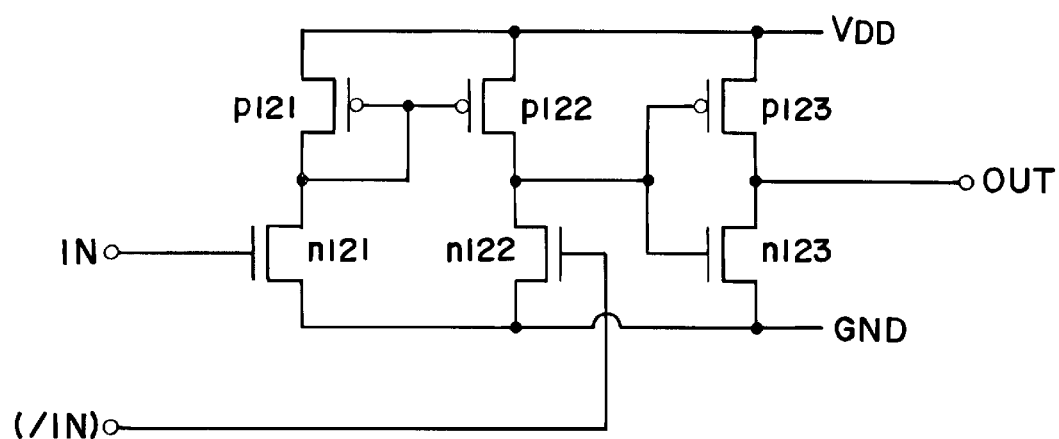
FIG. 12 is a diagram showing a conventional level shift circuit.
Figure 13:
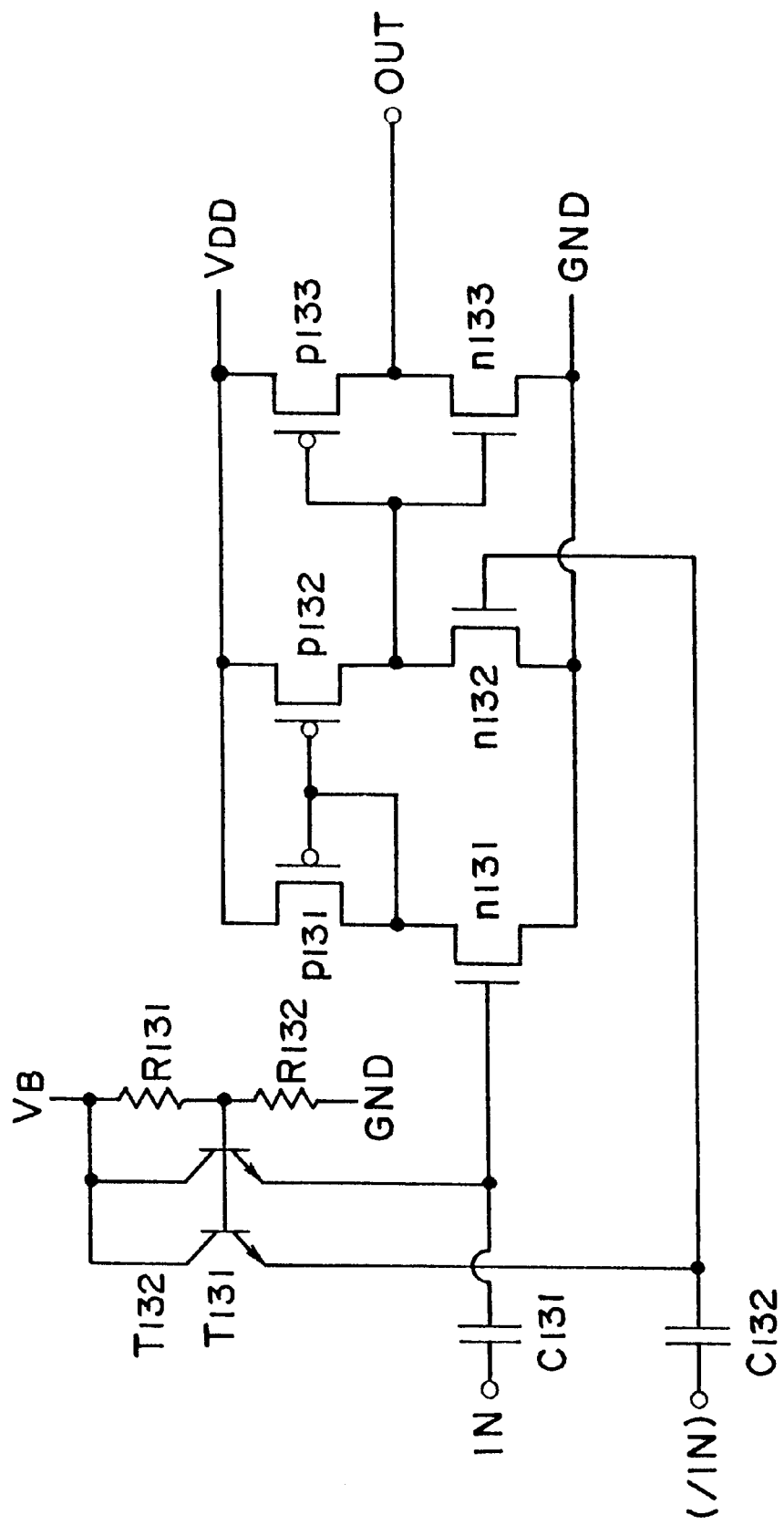
FIG. 13 is a diagram showing the conventional level shift circuit disclosed in Japanese Patent Laid-Open Publication No. HEI 4-242317.

FIG. 8 through FIG. 10 show a level shift circuit to be used for an image display device according to the fifth embodiment of the present invention. If the fluctuations in threshold voltage of the p-channel TFT and the n-channel TFT constituting the level shift circuit are small and the fluctuation in range of the operating point of the amplifier circuit section is small, then the bias voltage from the bias voltage setting section is not required to be adjusted to the threshold voltage of the transistor but allowed to be fixed. Therefore, the level shift circuit of the fifth embodiment of the present invention shown in FIG. 8 through FIG. 10 can be considered.

FIG. 8 shows capacitors $C_{81}$, $C_{82}$ and $C_{83}$, a p-channel TFT p81, an n-channel TFT n81 and other components similar to those of FIG. 1. The circuit of FIG. 8 differs from the level shift circuit of the first embodiment of the present invention shown in FIG. 1 in that the transistors are replaced by capacitors. The bias voltage is set according to a ratio of capacity $C_{82}$ of capacitor $C_{82}$ to capacity $C_{83}$ of capacitor $C_{83}$.

FIG. 9 shows capacitors $C_{91}$, $C_{92}$ and $C_{93}$, a p-channel TFT p91, n-channel TFT's n91 and n92, and other components similar to those of FIG. 1. The circuit of FIG. 9 differs from the level shift circuit of the third embodiment of the present invention shown in FIG. 5 in that the transistors are replaced by capacitors. A bias voltage set according to a ratio of capacity values $C_{92}$ to $C_{93}$ is clamped with a voltage dropped by the threshold voltage of the n-channel TFT n91.

FIG. 10 shows a capacitor $C_{101}$, resistors $R_{101}$ and $R_{102}$, a p-channel TFT p101, an n-channel TFT n101 and other components similar to those of FIG. 1. The circuit of FIG. 10 differs from the level shift circuit of the first embodiment of the present invention shown in FIG. 1 in that the transistors are replaced by resistors. A bias voltage is set according to a ratio of resistance values $R_{101}$ to $R_{102}$.

In the level shift circuit of the fifth embodiment of the present invention shown in FIG. 8 through FIG. 10, the bias voltage setting section is constructed of the capacitors or the resistors. Therefore, the bias voltage can be easily stably set without receiving the influence of the transistor characteristics.

In the level shift circuit of the fifth embodiment of the present invention, the transistor for voltage clamping use is provided between the bias voltage setting section employing the capacitors and the amplifier circuit section. However, it is acceptable to provide a transistor for voltage clamping use between the bias voltage setting section employing the resistors and the amplifier circuit section or provide two transistors for voltage clamping use as in the level shift circuit of the fourth embodiment of the present invention.

In the level shift circuit of the fifth embodiment of the present invention, the bias voltage setting section is constructed of one capacitor or resistor provided on each of the positive power voltage side and the negative power voltage side. However, the element or elements located on either or both the positive power voltage side and the negative power voltage side may be constructed of two or more elements.

According to the level shift circuit of the embodiments of the present invention, continuous grain boundary crystalline silicon may be used as polysilicon.

The level shift circuits of the embodiments of the present invention employ the CMOS inverter circuit for outputting a signal inverted with respect to the input signal as an amplifier circuit section that serves as an input signal amplitude amplifying means. However, a circuit means for outputting a signal that is not inverted with respect to the input signal may be employed instead.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A level shift circuit comprising:

a capacitance means provided for an input section, a bias voltage setting means for setting a DC voltage level of an input signal capacitively coupled with the capacitance means and an amplifying means for amplifying the amplitude of the input signal of which the DC voltage level is set, the bias voltage setting means comprising a voltage dividing means provided between a positive power voltage and a negative power voltage and the amplifying means having one input signal line, and wherein the voltage dividing means of the voltage setting means includes at least first and second transistors, wherein a gate of the first transistor is connected to the positive power voltage and a gate of the second transistor is connected to the negative power voltage.

2. A level shift circuit as claimed in claim 1, wherein the amplifying means is a CMOS inverter circuit.

3. A level shift circuit as claimed in claim 1, wherein the first transistor of the voltage dividing means is an n-channel transistor and the second transistor of the voltage dividing means is a p-channel transistor.

4. A level shift circuit comprising:

a capacitance means provided for an input section, a bias voltage setting means for setting a DC voltage level of an input signal capacitively coupled with the capacitance means and an amplifying means for amplifying the amplitude of the input signal of which the DC voltage level is set, the bias voltage setting means comprising a voltage dividing means provided between a positive power voltage and a negative power voltage and the amplifying means having one input signal line, wherein a p-channel transistor and an n-channel transistor are employed as the voltage dividing means, and wherein the bias voltage setting means is constructed so that a source of the p-channel transistor and a gate of the n-channel transistor are connected to the positive power voltage, a gate of the p-channel transistor and a source of the n-channel transistor are connected to the negative power voltage, and a drain of the p-channel transistor and a drain of the n-channel transistor are connected to an input terminal of the amplifying means.

5. A level shift circuit comprising:
a capacitance means provided for an input section, a bias voltage setting means for setting a DC voltage level of an input signal capacitively coupled with the capacitance means and an amplifying means for amplifying the amplitude of the input signal of which the DC voltage level is set,
the bias voltage setting means comprising a voltage dividing means provided between a positive power voltage and a negative power voltage and the amplifying means having one input signal line,
wherein a p-channel transistor and an n-channel transistor are employed as the voltage dividing means, and
wherein the bias voltage setting means is constructed so that a source of a p-channel transistor is connected to the positive power voltage, a source of an n-channel transistor is connected to the negative power voltage, and a gate and a drain of a p-channel transistor and a gate and a drain of an n-channel transistor are connected to an input terminal of the amplifying means.

6. A level shift circuit as claimed in claim 3, wherein the voltage dividing means is constructed of a plurality of p-channel transistors and a plurality of n-channel transistors.

7. A level shift circuit as claimed in claim 1, comprising a voltage clamping means for clamping the DC voltage level set by the bias voltage setting means.

8. A level shift circuit as claimed in claim 7, comprising a means for compensating for a voltage drop when the DC voltage level set by the bias voltage setting means are clamped by the voltage clamping means.

9. An image display device comprising:
a level shift circuit provided with a capacitance means provided for an input section, a bias voltage setting means for setting a DC voltage level of an input signal capacitively coupled with the capacitance means and an amplifying means for amplifying the amplitude of the input signal,
the bias voltage setting means comprising a voltage dividing means including at least first and second transistors between a positive power voltage and a negative power voltage, and the amplifying means having one input signal line, and
wherein a gate of the first transistor of the voltage dividing means is in communication with the positive power voltage and a gate of the second transistor of the voltage dividing means is in communication with the negative power voltage.

10. An image display device as claimed in claim 9, wherein the amplifying means is a CMOS inverter circuit.

11. An image display device as claimed in claim 9, wherein a p-channel transistor and an n-channel transistor are employed as the voltage dividing means.

12. An image display device as claimed in claim 9, comprising a voltage clamping means for clamping the DC voltage level set by the bias voltage setting means.

13. A level shift circuit comprising:
an input section comprising a capacitor,
a bias voltage setting section for setting a voltage level of an input signal capacitively coupled with the capacitor,
an amplifying section for amplifying an amplitude of the input signal,
wherein the bias voltage setting section comprises a voltage divider circuit provided between a positive power voltage and a negative power voltage and the amplifying section includes one input signal line coupled to an output of the bias voltage setting section, and
wherein the voltage divider circuit of the bias voltage setting section includes at least first and second transistors, wherein a gate of the first transistor is connected to the positive power voltage and a gate of the second transistor is connected to the negative power voltage.

14. An image display comprising the level shift circuit of claim 13.

15. The level shift circuit of claim 13, wherein the voltage divider circuit further comprises third and fourth transistors.

16. The level shift circuit of claim 13, further comprising a voltage clamping transistor provided between an output of the bias voltage setting section and an input of the amplifying section.

17. A level shift circuit comprising:
a capacitance means provided for an input section, a bias voltage setting means for setting a DC voltage level of an input signal capacitively coupled with the capacitance means and an amplifying means for amplifying the amplitude of the input signal of which the DC voltage level is set,
the bias voltage setting means comprising a voltage dividing means provided between a positive power voltage and a negative power voltage and the amplifying means having one input signal line, and
wherein the voltage dividing means of the bias voltage setting means includes at least first and second capacitors, wherein an electrode of the first capacitor is connected to the positive power voltage and an electrode of the second capacitor is connected to the negative power voltage.

18. An image display comprising the level shift circuit of claim 17.

19. The level shift circuit of claim 17, wherein the voltage divider circuit further comprises third and fourth capacitors.

20. The level shift circuit of claim 17, further comprising a voltage clamping transistor provided between an output of the bias voltage setting means and an input of the amplifying means.

21. A level shift circuit comprising:
an input section comprising a capacitor,
a bias voltage setting circuit for setting a voltage level of an input signal capacitively coupled with the capacitor,
an amplifying circuit for amplifying an amplitude of the input signal,
wherein the bias voltage setting circuit comprises a voltage divider circuit provided between a positive power voltage and a negative power voltage and the amplifying circuit includes one input signal line coupled to an output of the bias voltage setting circuit, and
wherein the voltage divider circuit includes at least first and second capacitors, wherein an electrode of the first capacitor is connected to the positive power voltage and an electrode of the second capacitor is connected to the negative power voltage.

22. A level shift circuit comprising:
an input section comprising a capacitor,
a bias voltage setting section for setting a voltage level of an input signal capacitively coupled with the capacitor,
an amplifying section for amplifying an amplitude of the input signal,
wherein the bias voltage setting section comprises a voltage divider circuit provided between a positive power voltage and a negative power voltage and the amplifying section includes one input signal line coupled to an output of the bias voltage setting section, and wherein the voltage divider circuit of the bias voltage setting section includes at least first and second resistors, wherein the first resistor is connected to the positive power voltage and the second resistor is connected to the negative power voltage.

* * * * *

UNITED STATES PATENT AND TRADEMARK OFFICE
CERTIFICATE OF CORRECTION

PATENT NO.     : 6,522,323 B1
DATED          : February 18, 2003
INVENTOR(S)    : Sasaki et al.

It is certified that error appears in the above-identified patent and that said Letters Patent is hereby corrected as shown below:

<u>Title page,</u>
Item [30], Foreign Application Priority Data, should be:
-- Mar. 30, 2000  (JP)   2000-092725 --

Signed and Sealed this

Twenty-fourth Day of June, 2003

JAMES E. ROGAN
*Director of the United States Patent and Trademark Office*